United States Patent
Xu et al.

(10) Patent No.: US 9,190,596 B2
(45) Date of Patent: *Nov. 17, 2015

(54) THREE-DIMENSIONAL THERMOELECTRIC ENERGY HARVESTER AND FABRICATION METHOD THEREOF

(75) Inventors: Dehui Xu, Shanghai (CN); Bin Xiong, Shanghai (CN); Yuelin Wang, Shanghai (CN)

(73) Assignee: SHANGHAI INSTITUTE OF MICROSYSTEM AND INFORMATION TECHNOLOGY, CHINESE ACADEMY of SCIENCE, Changning District, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/110,144

(22) PCT Filed: Apr. 5, 2012

(86) PCT No.: PCT/CN2012/073533
§ 371 (c)(1),
(2), (4) Date: Oct. 4, 2013

(87) PCT Pub. No.: WO2013/127113
PCT Pub. Date: Sep. 6, 2013

(65) Prior Publication Data
US 2014/0026934 A1    Jan. 30, 2014

(30) Foreign Application Priority Data

Feb. 28, 2012   (CN) .......................... 2012 1 0048653

(51) Int. Cl.
*H01L 35/32*    (2006.01)
*H01L 27/16*    (2006.01)
*H01L 35/34*    (2006.01)

(52) U.S. Cl.
CPC ................ *H01L 35/32* (2013.01); *H01L 27/16* (2013.01); *H01L 35/34* (2013.01)

(58) Field of Classification Search
CPC ................................. H01L 35/32; H01L 35/34
USPC ...................................... 136/224, 201; 438/54
See application file for complete search history.

(56) References Cited

U.S. PATENT DOCUMENTS

| 5,837,929 A * | 11/1998 | Adelman ....................... 136/225 |
| 6,410,840 B1 * | 6/2002 | Sudo et al. ..................... 136/201 |
| 6,614,109 B2 * | 9/2003 | Cordes et al. ................. 257/712 |

(Continued)

*Primary Examiner* — Golam Mowla
(74) *Attorney, Agent, or Firm* — Global IP Services; Tianhua Gu

(57) ABSTRACT

A three-dimensional thermoelectric energy harvester and a fabrication method thereof. Low-resistivity silicon is etched to form a plurality of grooves and silicon columns between the grooves, and an insulating layer is formed on a surface of the groove, and thermoelectric columns are fabricated by using a thin-film deposition technique, so that the thermoelectric column and a neighboring silicon column form a thermocouple pair; and then, a metal wiring is fabricated by processes such as etching and deposition, followed by thinning of the substrate and bonding of the supporting substrates, thereby completing fabrication of the three-dimensional thermoelectric energy harvester. Fabrication of the thermocouple pair structure by one thin-film deposition process simplifies the fabrication process. The thermocouple pair using silicon ensures a high Seebeck coefficient. The use of vertical thermocouple pairs having a column structure improves the mechanical stability of the thermoelectric energy harvester.

6 Claims, 9 Drawing Sheets

(56) References Cited

U.S. PATENT DOCUMENTS

| | | | |
|---|---|---|---|
| 6,759,586 B2 * | 7/2004 | Shutoh et al. | 136/205 |
| 6,793,389 B2 * | 9/2004 | Chavan et al. | 374/179 |
| 6,818,470 B1 * | 11/2004 | Acklin et al. | 438/55 |
| 7,893,529 B2 * | 2/2011 | Hsu et al. | 257/713 |
| 2003/0033818 A1 * | 2/2003 | Kucherov et al. | 62/3.1 |
| 2004/0118129 A1 * | 6/2004 | Chrysler et al. | 62/3.2 |
| 2007/0095381 A1 * | 5/2007 | Lee | 136/230 |
| 2007/0221264 A1 * | 9/2007 | Shutoh et al. | 136/224 |
| 2010/0176506 A1 * | 7/2010 | Hsu et al. | 257/698 |

* cited by examiner

THREE-DIMENSIONAL THERMOELECTRIC ENERGY HARVESTER AND FABRICATION METHOD THEREOF

CROSS REFERENCE TO RELATED PATENT APPLICATION

The present application is the US national stage of PCT/CN2012/073533 filed on Apr. 5, 2012, which claims the priority of the Chinese patent application No. 201210048653.8 filed on Feb. 28, 2012, which application is incorporated herein by reference.

BACKGROUND OF THE PRESENT INVENTION

1. Field of Invention

The present invention relates to the semiconductor field, and specifically to a three-dimensional thermoelectric energy harvester and a fabrication method thereof.

2. Description of Related Art

With the development of the Internet of Things, its applications in the industrial, commercial, medical, consumption and military fields are gradually expanded. Power source is always critical to prolonging the service life and reducing the cost of the Internet of Things. In environmental extremes or other occasions unreachable to human beings, or when a network node moves or changes, it is difficult or even impossible to replace a battery, making it crucial to effectively provide energy to a node of the Internet of Things. An effective solution is to harvest ambient energy through energy harvesting, store the energy and provide the energy to the node of the Internet of Things. Temperature difference is widely present in the external environment. Therefore, energy harvesting using the temperature difference in the environment has been extensively studied.

A vertical-type miniature thermoelectric energy harvester as shown in FIG. 1 is currently commonly used, because the direction of heat flow is perpendicular to the substrate, and the thermoelectric energy harvesting efficiency is high. Upper and lower substrates exchange heat with the external environment, and transfer an external temperature difference to a thermopile, and the thermopile converts the temperature difference in the external environment to a voltage signal by using the Seebeck effect and outputs the voltage signal, thereby harvesting external energy. Since thermocouples are arranged perpendicular to the substrate, a planar semiconductor process cannot be adopted, and instead, the thermocouples are generally fabricated by an electroplating or thin-film sputtering deposition process. Current vertical-type thermoelectric energy harvesting chips generally adopt a BiTe-based material or a metal material such as Cu or Ni as the thermoelectric material. Since the metal material such as Cu or Ni is a conductor structure having a small Seebeck coefficient, thermoelectric energy harvesting chips fabricated by using the metal material such as Cu or Ni as the thermoelectric material generally have low efficiency. Since the BiTe-based material is a semiconductor structure having a high Seebeck coefficient, thermoelectric energy harvesting chips fabricated by using the BiTe-based material generally have high efficiency. However, the BiTe-based material requires a high cost, and contains toxic substances, which limits the use of BiTe thermoelectric energy harvesting chips. In addition, since the composition of a thermocouple requires two thermoelectric materials, the vertical-type thermoelectric energy harvester generally needs to be subjected to two electroplating or thin-film sputtering deposition processes in order to fabricate a thermocouple material, which further increases the cost of the thermoelectric energy harvesting chip. Moreover, the fabrication efficiency of the vertical-type thermoelectric energy harvester is low, because the thermoelectric energy harvester is thermally and mechanically connected to the upper and lower substrates through chip-level bonding.

In view of the above reasons, it is necessary to provide a low-cost, high-efficiency thermoelectric energy harvester.

SUMMARY OF THE PRESENT INVENTION

In view of the disadvantages in the prior art, a purpose of the present invention is to provide a three-dimensional thermoelectric energy harvester and a fabrication method thereof, so as to solve the problems of high fabrication cost, low fabrication efficiency and low energy harvesting efficiency of thermoelectric energy harvesters in the prior art.

In order to accomplish the above and other purposes, the present invention provides a method for fabricating a three-dimensional thermoelectric energy harvester, at least comprising: 1) providing a silicon substrate, and etching an upper surface of the silicon substrate to form a plurality of grooves, two neighboring of which are arranged at an interval, so that the grooves and regions for preparing silicon columns between the grooves form a thermopile region; 2) forming an insulating layer on a surface of the groove, and then filling a thermoelectric material in the grooves to form a plurality of thermoelectric columns, so that the thermoelectric column and silicon in a neighboring region for preparing a silicon column form a quasi thermocouple pair; 3) fabricating an upper metal wiring to connect the thermoelectric column and silicon in the region for preparing a silicon column in a same quasi thermocouple pair, and then fabricating an upper passivation layer on the upper surface of the silicon substrate; 4) providing an upper supporting substrate, and bonding the upper supporting substrate to the upper passivation layer; 5) thinning the silicon substrate until a lower surface of the quasi thermocouple pair is exposed; 6) fabricating a lower metal wiring to connect the thermoelectric column and silicon in the region for preparing a silicon column in two neighboring quasi thermocouple pairs, and then fabricating a lower passivation layer on a lower surface of the silicon substrate; 7) etching the silicon substrate to form an annular groove in a periphery around the thermopile region, so as to isolate silicon in the regions for preparing silicon columns from the silicon substrate to form a plurality of silicon columns, so that the thermoelectric column and a neighboring silicon column form a thermocouple pair; and 8) providing a lower supporting substrate, and bonding the lower supporting substrate to the lower passivation layer, thereby completing fabrication of the three-dimensional thermoelectric energy harvester.

In the method for fabricating a three-dimensional thermoelectric energy harvester consistent with the present invention, the thermoelectric column and the silicon column are rectangular column structures or cylindrical structures.

As a preferred solution of the method for fabricating a three-dimensional thermoelectric energy harvester consistent with the present invention, the step 7) further comprises a step of filling an electrical and thermal insulating material in the annular groove.

As a preferred solution of the method for fabricating a three-dimensional thermoelectric energy harvester consistent with the present invention, the bonding process in the step 4) is wafer-level hermetic bonding, and the bonding process in the step 8) is wafer-level vacuum bonding.

As a preferred solution of the method for fabricating a three-dimensional thermoelectric energy harvester consistent with the present invention, the upper supporting substrate and the lower supporting substrate each comprise a CMOS circuit structure, the upper passivation layer and the lower passivation layer each are etched to form a contact hole, and the CMOS circuits are connected to the upper metal wiring and the lower metal wiring through the contact holes.

In the method for fabricating a three-dimensional thermoelectric energy harvester consistent with the present invention, the thermoelectric column is made of a BiTe-based material, a polysilicon material, or metal Cu, Ni or Au, and the silicon substrate is a low-resistivity silicon wafer.

The present invention further provides a three-dimensional thermoelectric energy harvester, at least comprising:

a thermopile, comprising: a plurality of thermocouple pairs, wherein each of the thermocouple pairs is formed by a first thermoelectric column and a second thermoelectric column; an insulating layer, combined between the first thermoelectric column and the second thermoelectric column and between the thermocouple pairs; an upper metal wiring, connected to upper surfaces of the first thermoelectric column and the second thermoelectric column in a same thermocouple pair; and a lower metal wiring, connected to lower surfaces of the first thermoelectric column and the second thermoelectric column in two neighboring thermocouple pairs;

passivation layers, comprising: an upper passivation layer, combined to an upper surface of the thermopile; and a lower passivation layer, combined to a lower surface of the thermopile; and supporting substrates, comprising: an upper supporting substrate, combined to the thermo upper passivation layer; and a lower supporting substrate, combined to the lower passivation layer.

In the three-dimensional thermoelectric energy harvester consistent with the present invention, the first thermoelectric column and the second thermoelectric column are compactly arranged through the insulating layer.

In the three-dimensional thermoelectric energy harvester consistent with the present invention, the first thermoelectric column and the second thermoelectric column are rectangular column structures or cylindrical structures.

As a preferred solution of the three-dimensional thermoelectric energy harvester consistent with the present invention, the three-dimensional thermoelectric energy harvester further comprises an electrical and thermal insulating material combined around the thermopile.

As a preferred solution of the three-dimensional thermoelectric energy harvester consistent with the present invention, the upper supporting substrate and the lower supporting substrate each comprise a CMOS circuit structure, the upper passivation layer and the lower passivation layer each have a contact hole, and the CMOS circuit structures are connected to the thermopile through the contact holes.

As a preferred solution of the three-dimensional thermoelectric energy harvester consistent with the present invention, the first thermoelectric column is made of a BiTe-based material, a polysilicon material, and metal Cu, Ni or Au, and the second thermoelectric column is made of a low-resistivity silicon material.

As described above, the three-dimensional thermoelectric energy harvester and fabrication method thereof consistent with the present invention have the following beneficial effects: Low-resistivity silicon is etched to form a plurality of grooves and silicon columns between the grooves, and an insulating layer is formed on a surface of the groove, and thermoelectric columns are fabricated by using a thin-film deposition technique, so that the thermoelectric column and a neighboring silicon column form a thermocouple pair; and then, a metal wiring is fabricated by processes such as etching and deposition, followed by thinning of the substrate and bonding of the supporting substrates, thereby completing fabrication of the three-dimensional thermoelectric energy harvester. Compared with a miniature thermoelectric energy harvester in the prior art, the present invention has the following advantages:

1) Fabrication of the thermocouple pair structure is completed by only one thin-film deposition process, which simplifies the fabrication process.

2) The use of silicon as a component of the thermocouple pair ensures that the thermocouple has a high Seebeck coefficient.

3) The use of vertical thermocouple pairs having a column structure improves the mechanical stability of the thermoelectric energy harvester.

4) Since the thermocouple structure is bonded to the upper supporting substrate and the lower supporting substrate by wafer-level bonding, the fabrication efficiency is improved.

LIST OF REFERENCE NUMERALS

Figure 1:
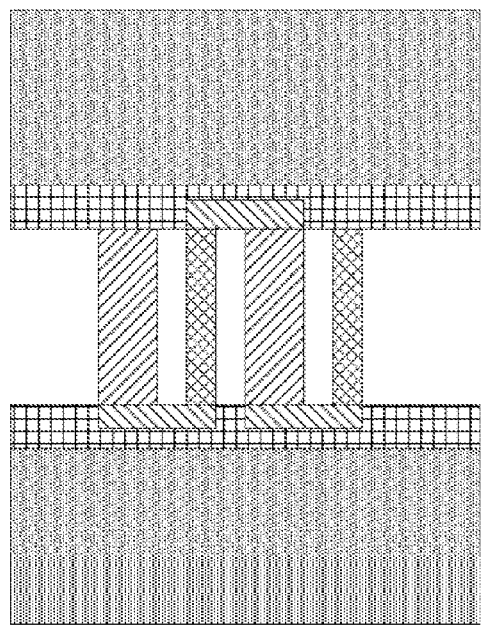
FIG. 1 is a schematic structural view of a thermoelectric energy harvester in the prior art.

101 Silicon substrate
102 Groove
103 Silicon column, first thermoelectric column
104 Insulating layer
105 Thermoelectric column, second thermoelectric column
106 Upper metal wiring
107 Lower metal wiring
108 Annular groove
109 Electrical and thermal insulating material
111 Upper supporting substrate
112 Lower supporting substrate
113, 114 CMOS circuit structure
115 Contact hole
121 Upper passivation layer
122 Lower passivation layer

DETAILED DESCRIPTION OF THE PREFERRED EMBODIMENTS

The embodiments of the present invention are described in the following through specific examples, and one of ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

Reference is made to FIG. 2 to FIG. 14. It should be noted that, the drawings provided in the embodiment merely exemplarily describe a basic concept of the present invention, and the drawings merely show components related to the present invention, but are not drawn according to the numbers, shapes and sizes of components in actual implementation. The shapes, the numbers and the sizes of the components can be randomly changed in the actual implementation, and the layout of components may be more complicated.

Embodiment 1

Referring to FIG. 2 to FIG. 11, the present invention provides a method for fabricating a three-dimensional thermoelectric energy harvester, which at least includes the following steps.

Figure 2:
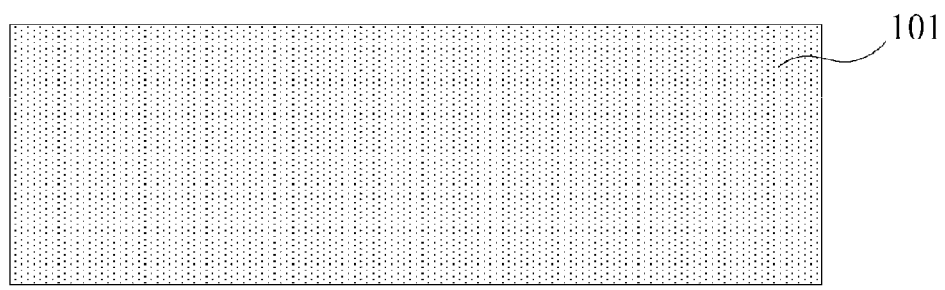
FIG. 2 to FIG. 3B are respectively schematic structural top and cross-sectional views of step 1) of a method for fabricating a three-dimensional thermoelectric energy harvester consistent with the present invention.
Figure 3A:
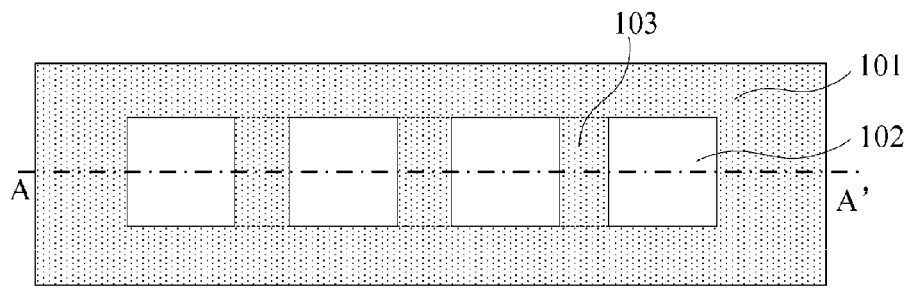
Figure 3B:
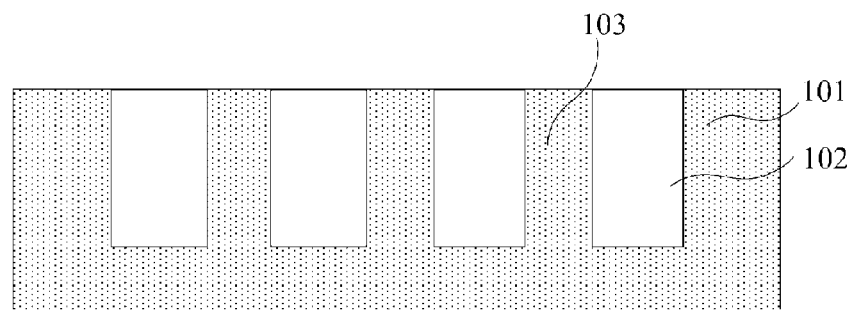
Figure 4A:
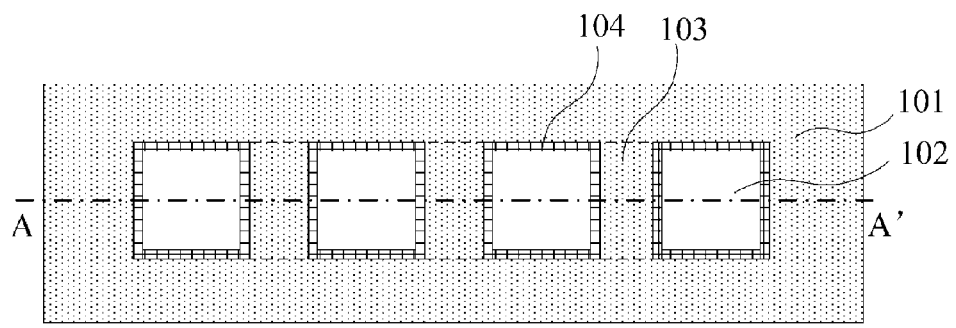
FIG. 4A to FIG. 5B are respectively schematic structural top and cross-sectional views of step 2) of the method for fabricating a three-dimensional thermoelectric energy harvester consistent with the present invention.
Figure 4B:
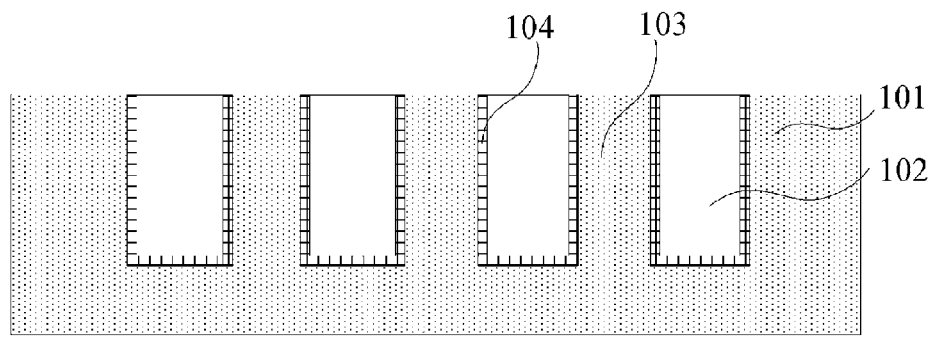
Figure 5A:
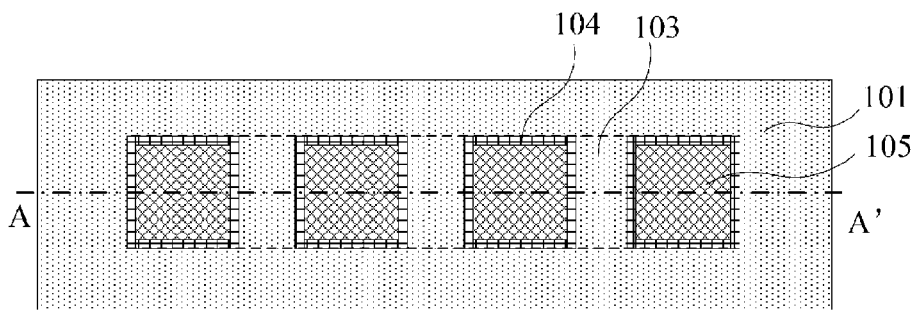
Figure 5B:
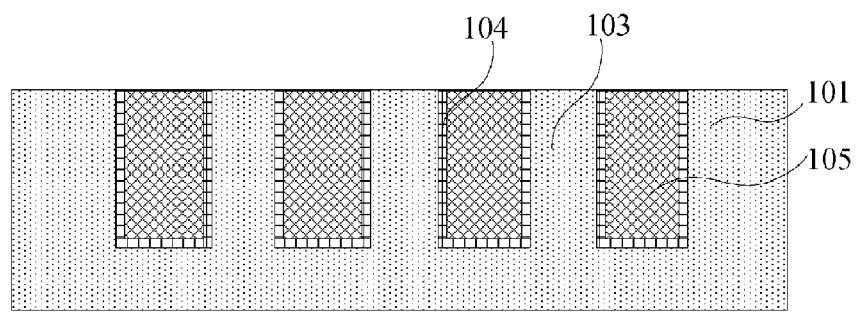

First, as shown in FIG. 2 to FIG. 3B, step 1) is performed, wherein a silicon substrate 101 is provided, and an upper surface of the silicon substrate 101 is etched to form a plurality of grooves 102, two neighboring of which are arranged at an interval, so that the grooves 102 and regions for preparing silicon columns 103 between the grooves 102 form a thermopile region. In this embodiment, the silicon substrate 101 is a low-resistivity silicon substrate 101, which has a high Seebeck coefficient and low resistivity, and therefore can ensure high thermoelectric efficiency when being fabricated into a thermoelectric column. To ensure a precise process, in this step, the low-resistivity silicon substrate 101 is polished first, and then a photolithographic pattern is fabricated on a surface of the low-resistivity silicon substrate 101, and the low-resistivity silicon substrate 101 is etched to form, in the low-resistivity silicon substrate 101, a plurality of grooves 102, two neighboring of which are arranged at a particular interval. Considering the process consistency and smoothness, the groove 102 is a rectangular column structure. Definitely, in other embodiments, the groove may also be column structures of other shapes such as a cylindrical structure. The region for preparing a silicon column 103 is a region sandwiched between two opposite sides of the two neighboring grooves 102 in the low-resistivity silicon substrate 101, and therefore the silicon column 103 is also a rectangular column structure. The grooves 102 and the regions for preparing silicon columns 103 between the grooves 102 form a thermopile region.

Next, as shown in FIG. 4A to FIG. 5B, step 2) is performed, wherein an insulating layer 104 is formed on a surface of the groove 102, and then a thermoelectric material is filled in the grooves 102 to form a plurality of thermoelectric columns 105, so that the thermoelectric column 105 and silicon in a neighboring region for preparing a silicon column 103 form a quasi thermocouple pair. In this embodiment, a $SiO_2$ film is deposited in the groove 102 by chemical vapor deposition or physical vapor deposition to insulate the surface of the groove 102. Definitely, a material such as $Si_3N_4$ may also be used to fabricate a thin-film insulating layer 104. Afterward, a thermoelectric material is deposited in the groove 102 by using a thin-film deposition technique such as chemical vapor deposition or physical vapor deposition. In this embodiment, the thermoelectric material is a BiTe-based material in order to ensure high thermoelectric conversion performance. Definitely, in other embodiments, the thermoelectric material may be a polysilicon material, and metal Cu, Ni or Au, or the like. The thermoelectric column 105 and silicon in a neighboring region for preparing a silicon column 103 form a quasi thermocouple pair.

Figure 6A:
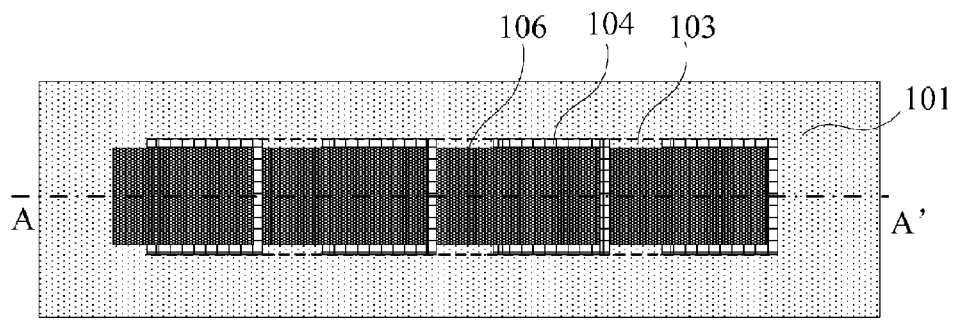
FIG. 6A to FIG. 6C are respectively schematic structural top and cross-sectional views of step 3) of the method for fabricating a three-dimensional thermoelectric energy harvester consistent with the present invention.
Figure 6B:
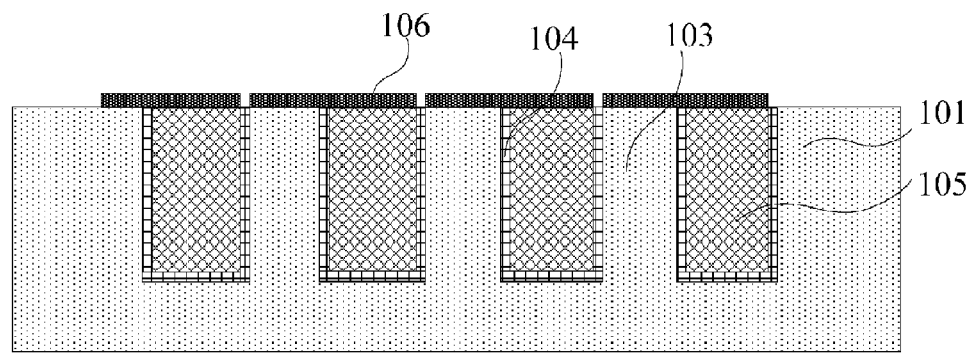
Figure 6C:
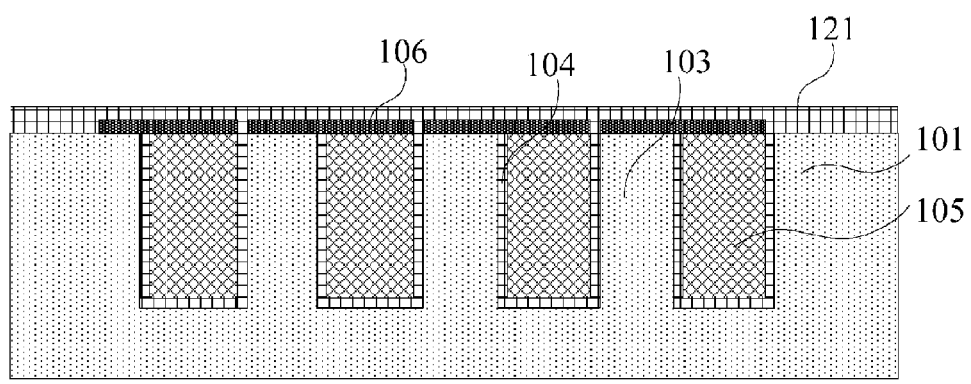

Then, as shown in FIG. 6A to FIG. 6C, step 3) is performed, wherein an upper metal wiring 106 is fabricated to connect the thermoelectric column 105 and silicon in the region for preparing a silicon column 103 in a same quasi thermocouple pair, and then an upper passivation layer 121 is fabricated on the upper surface of the silicon substrate. In this embodiment, an upper metal wiring 106 is fabricated on the upper surface of each quasi thermocouple pair by using photolithography and deposition techniques, so as to connect the thermoelectric column 105 and silicon in the region for preparing a silicon column 103 in each quasi thermocouple pair. Afterward, an upper passivation layer 121 is fabricated on the upper surface of the silicon substrate 101 by chemical vapor deposition, wherein the upper passivation layer is made of $SiO_2$, $Si_3N_4$ or the like.

Figure 7:
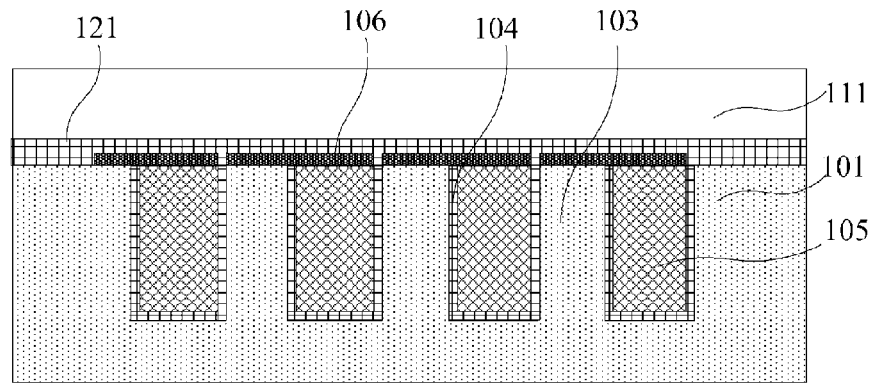
FIG. 7 is a schematic structural cross-sectional view of step 4) of the method for fabricating a three-dimensional thermoelectric energy harvester consistent with the present invention.

Then, as shown in FIG. 7, step 4) is performed, wherein an upper supporting substrate 111 is provided, and the upper supporting substrate 111 is bonded to the upper passivation layer 121. In this embodiment, the upper supporting substrate 111 has good thermal conduction properties.

Figure 8:
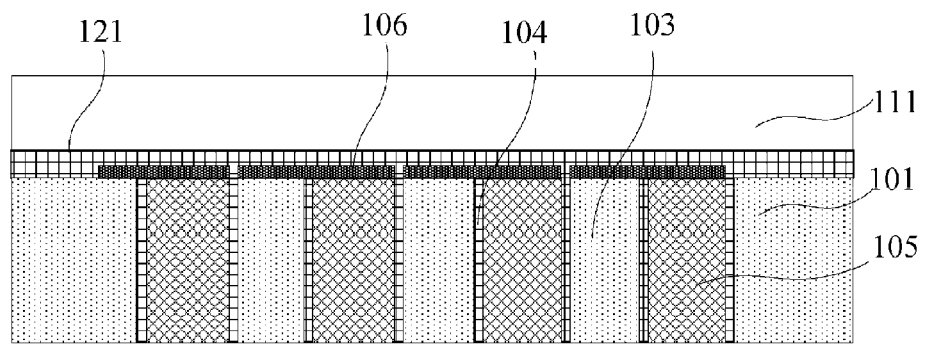
FIG. 8 is a schematic structural cross-sectional view of step 5) of the method for fabricating a three-dimensional thermoelectric energy harvester consistent with the present invention.

Then, as shown in FIG. 8, step 5) is performed, wherein the silicon substrate 101 is thinned until a lower surface of the quasi thermocouple pair is exposed. In this embodiment, a lower surface of the silicon substrate 101 is etched by chemical corrosion with HF or a mixture of HF and $HNO_3$ as an etching solution, wherein the structure of the insulating layer 104 at the bottom of the groove 102 is etched until the lower surface of the quasi thermocouple pair is exposed, and the surface after etching may be polished by mechanical chemical polishing to prepare for subsequent processes. Definitely, the silicon substrate 101 may also be thinned by directly using mechanical chemical polishing.

Figure 9A:
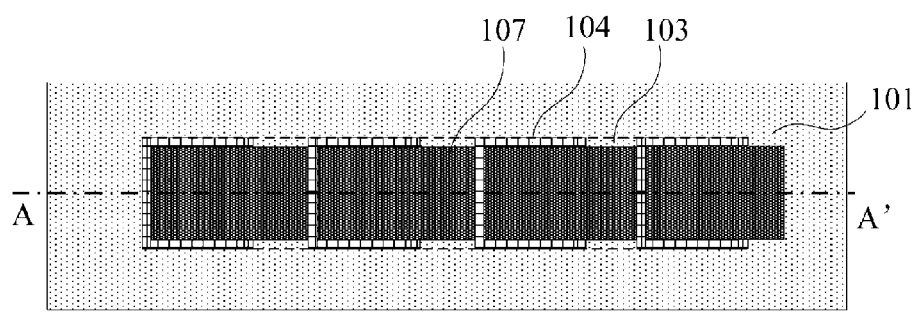
FIG. 9A to FIG. 9C are respectively schematic structural top and cross-sectional views of step 6) of the method for fabricating a three-dimensional thermoelectric energy harvester consistent with the present invention.
Figure 9B:
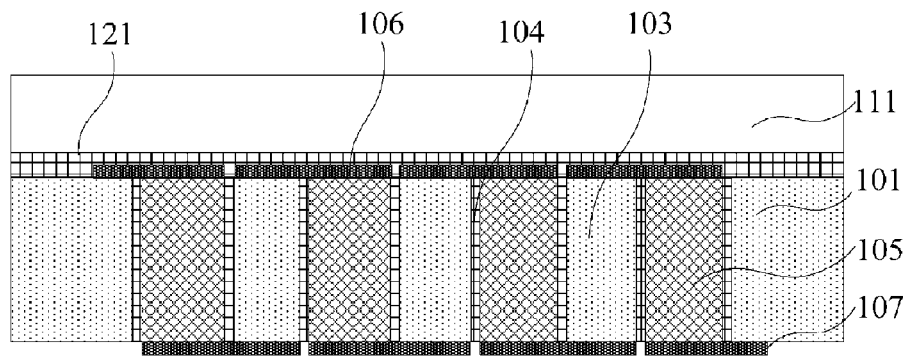
Figure 9C:
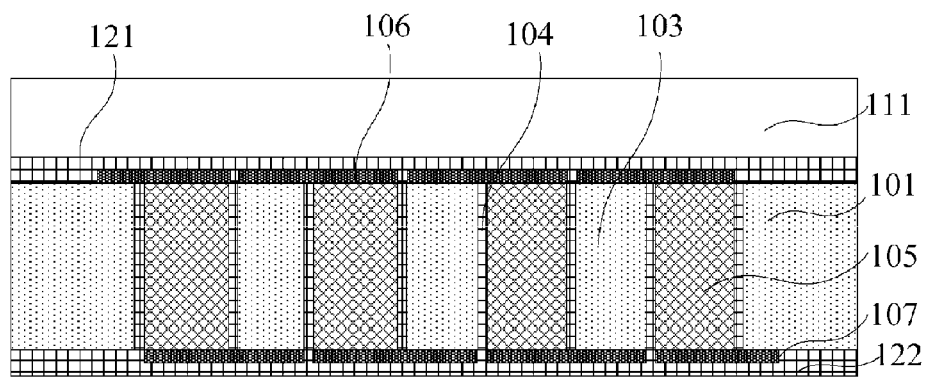

Then, as shown in FIG. 9A to FIG. 9C, step 6) is performed, wherein a lower metal wiring 107 is fabricated to connect the thermoelectric column 105 and silicon in the region for preparing a silicon column 103 in two neighboring quasi thermocouple pairs, and then a lower passivation layer 122 is fabricated on a lower surface of the silicon substrate 101. In this embodiment, the lower metal wiring 107 is fabricated by using photolithography and deposition techniques, so as to connect the thermoelectric column 105 and silicon in the region for preparing a silicon column 103 in two neighboring quasi thermocouple pairs, that is, the thermoelectric column 105 and silicon in the neighboring region for preparing a silicon column 103 in two neighboring quasi thermocouple pairs are connected by the lower metal wiring 107. Afterward, a lower passivation layer 122 is fabricated on the lower surface of the silicon substrate 101 by a method such as chemical vapor deposition, wherein the lower passivation layer is made of $SiO_2$, $Si_3N_4$ or the like.

Figure 10A:
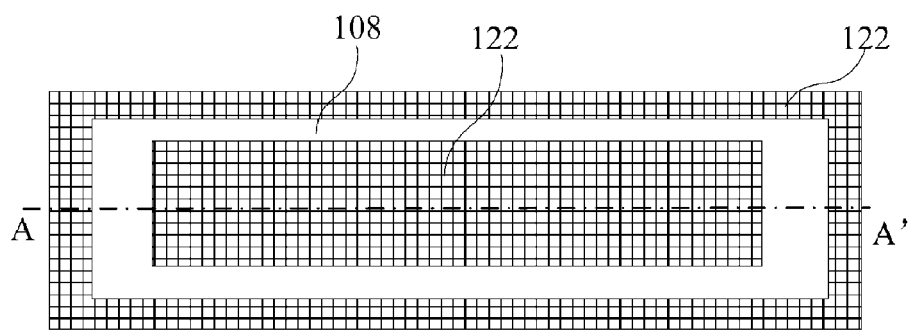
FIG. 10A and FIG. 10B are respectively schematic structural top and cross-sectional views of step 7) of the method for fabricating a three-dimensional thermoelectric energy harvester consistent with the present invention.
Figure 10B:
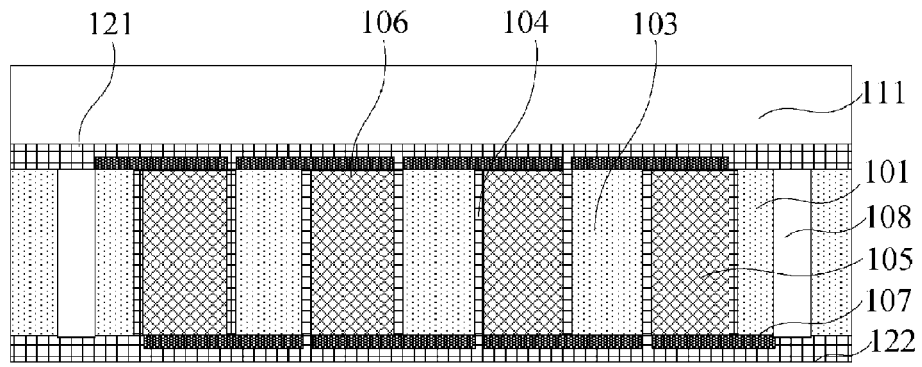

Then, as shown in FIG. 10A and FIG. 10B, step 7) is performed, wherein the silicon substrate 101 is etched to form an annular groove 108 in a periphery around the thermopile region, so as to isolate silicon in the regions for preparing silicon columns 103 from the silicon substrate 101 to form a plurality of silicon columns 103, so that the thermoelectric column 105 and a neighboring silicon column 103 form a thermocouple pair. In this embodiment, the periphery around the thermopile region on the surface of the silicon substrate 101 is etched by chemical corrosion with the photolithographic pattern as a mask, so as to isolate silicon in the regions for preparing silicon columns 103 from the silicon substrate 101 to form a plurality of silicon columns 103, so that the thermoelectric column 105 and a neighboring silicon column 103 form a thermocouple pair. That is, the region surrounded by the annular groove 108 includes the thermoelectric column 105, the silicon column 103, and the insulating layer 104 around the thermoelectric column 105.

Figure 11:
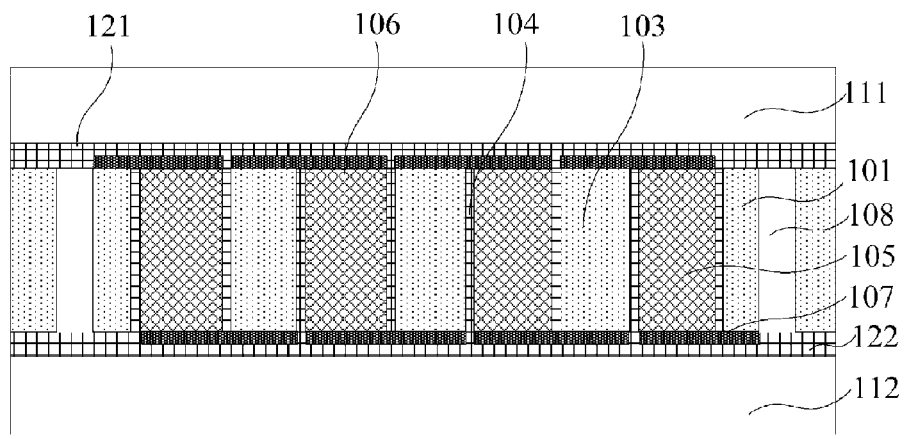
FIG. 11 is a schematic structural cross-sectional view of step 8) of the method for fabricating a three-dimensional thermoelectric energy harvester consistent with the present invention.

Finally, as shown in FIG. 11, step 8) is performed, wherein a lower supporting substrate 112 is provided, and the lower supporting substrate 112 is bonded to the lower passivation layer 122, thereby completing fabrication of the three-dimensional thermoelectric energy harvester. The lower supporting substrate 112 also has good thermal conduction properties.

Embodiment 2

Referring to FIG. 2 to FIG. 10B and FIG. 12, basic steps of the method for fabricating a three-dimensional thermoelectric energy harvester in this embodiment are as described in Embodiment 1. To further improve the mechanical stability and thermoelectric efficiency of a thermopile, the step 7) further includes a step of filling an electrical and thermal insulating material 109 in the annular groove 108.

Embodiment 3

Referring to FIG. 2 to FIG. 10B, FIG. 13 and FIG. 14, basic steps of the method for fabricating a three-dimensional thermoelectric energy harvester in this embodiment are as described in Embodiment 1 or 2. To achieve monolithic integration of the three-dimensional thermoelectric energy harvester consistent with the present invention and a circuit so as to directly supply power to the circuit on-chip, the method for fabricating a three-dimensional thermoelectric energy harvester consistent with the present invention further includes a step of fabricating CMOS circuit structures 113 and 114 on the upper supporting substrate 111 and the lower supporting substrate 112, wherein the upper passivation layer 121 and the lower passivation layer 122 each are etched to form a contact hole 115, and then metal wires are fabricated through the contact holes 115 to respectively connect the CMOS circuits structures and the upper metal wiring and the lower metal wiring. Afterward, the upper passivation layer 121 and the lower passivation layer 122 are bonded to the upper supporting substrate 111 and the lower supporting substrate 112. In this embodiment, to completely adopt the CMOS process so as to reduce the fabrication cost, the filled thermoelectric material may be replaced with a polysilicon material of a different doping type from the silicon substrate 101.

Embodiment 4

Referring to FIG. 2 to FIG. 11, basic steps of the method for fabricating a three-dimensional thermoelectric energy harvester in this embodiment are as described in Embodiment 1. To improve the sensitivity and efficiency of components, in the method for fabricating a three-dimensional thermoelectric energy harvester consistent with the present invention, the bonding process in the step 4) is wafer-level hermetic bonding, and the bonding process in the step 8) is wafer-level vacuum bonding.

Embodiment 5

Referring to FIG. 11, the present invention further provides a three-dimensional thermoelectric energy harvester, which at least includes:

a thermopile, including a plurality of thermocouple pairs, wherein each of the thermocouple pairs is formed by a first thermoelectric column 103 and a second thermoelectric column 105. In this embodiment, to improve the integration of components, the first thermoelectric column and the second thermoelectric column are compactly arranged through the insulating layer and to ensure the smoothness of components and the process consistency, the first thermoelectric column 103 and the second thermoelectric column 105 are rectangular column structures. Definitely, in other embodiments, the first thermoelectric column 103 and the second thermoelectric column 105 may also be column structures of other shapes such as a cylindrical structure. The first thermoelectric column 103 is made of a BiTe-based material so as to ensure the thermoelectric conversion efficiency of the thermocouple. Definitely, in other embodiments, the first thermoelectric column 103 may also be made of a polysilicon material, or metal Cu, Ni or Au, or other thermoelectric materials. The second thermoelectric column 105 is made of a low-resistivity silicon material, which has a high Seebeck coefficient and low resistivity, and therefore can ensure high thermoelectric efficiency when being fabricated into a thermoelectric column. The thermopile further includes an insulating layer 104, combined between the first thermoelectric column 103 and the second thermoelectric column 105 and between the thermocouple pairs, to insulate the first thermoelectric column 103 and the second thermoelectric column 105 in a same thermocouple pair, and to insulate two neighboring thermocouple pairs.

The thermopile further includes an upper metal wiring 106 and a lower metal wiring 107. The upper metal wiring 106 is connected to upper surfaces of the first thermoelectric column 103 and the second thermoelectric column 105 in a same thermocouple pair, and the lower metal wiring 107 is connected to lower surfaces of the first thermoelectric column 103 and the second thermoelectric column 105 in two neighboring thermocouple pairs.

The three-dimensional thermoelectric energy harvester further comprises passivation layers, including an upper passivation layer 121 combined to an upper surface of the thermopile and a lower passivation layer 122 combined to a lower surface of the thermopile. The upper passivation layer and the lower passivation layer have thicknesses greater than those of the upper metal wiring 106 and the lower metal wiring 107, and are made of $SiO_2$, $Si_3N_4$ or the like.

The three-dimensional thermoelectric energy harvester further includes supporting substrates, including an upper supporting substrate 111 combined to the upper passivation layer 121 and a lower supporting substrate 112 combined to the lower passivation layer 122. Both the upper supporting substrate 111 and the lower supporting substrate 111 have good thermal conduction properties.

Embodiment 6

Figure 12:
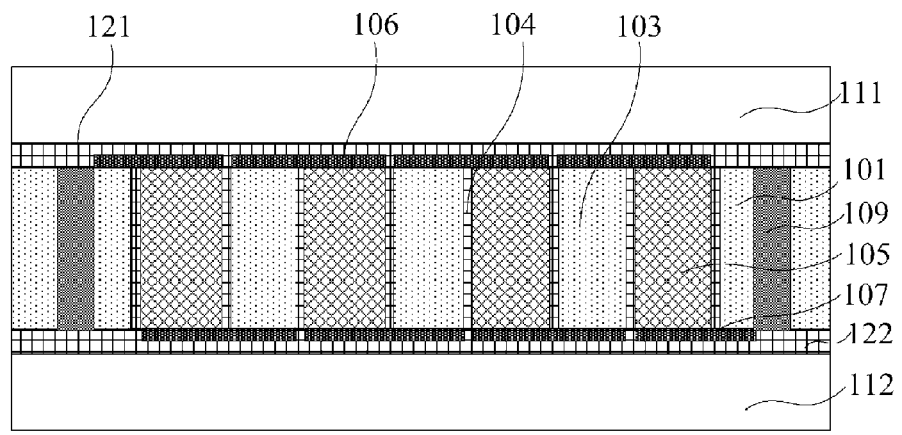
FIG. 12 is a schematic structural cross-sectional view of a three-dimensional thermoelectric energy harvester consistent with the present invention when an annular groove is filled with an electrical and thermal insulating material.

Referring to FIG. 12, the basic structure of the three-dimensional thermoelectric energy harvester in this embodiment is as described in Embodiment 5. To further improve the mechanical stability and thermoelectric efficiency of the thermopile, the three-dimensional thermoelectric energy harvester further includes an electrical and thermal insulating material 109 combined around the thermopile.

Embodiment 7

Figure 13:
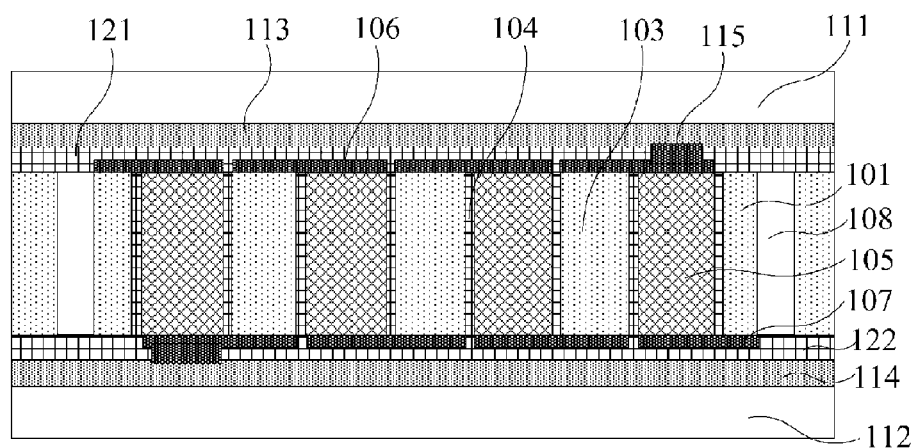
FIG. 13 is a schematic structural cross-sectional view of a three-dimensional thermoelectric energy harvester consistent with the present invention when upper and lower supporting substrates each have a CMOS circuit structure.
Figure 14:
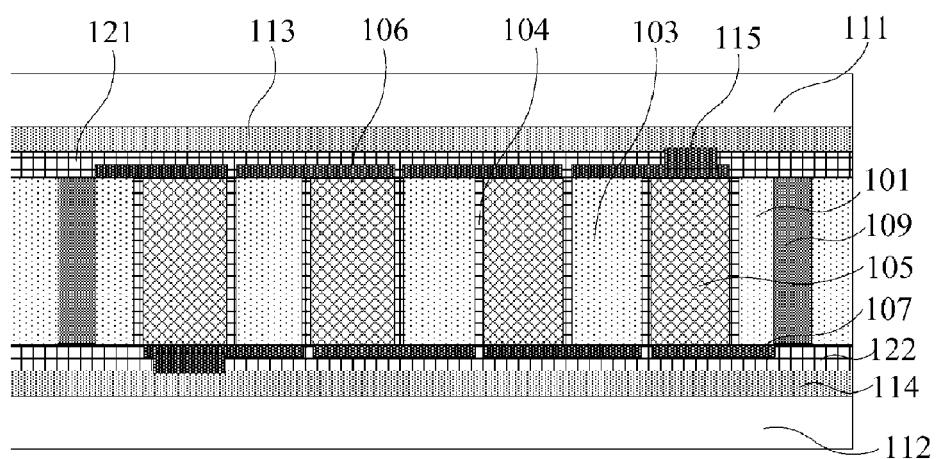
FIG. 14 is a schematic structural cross-sectional view of a three-dimensional thermoelectric energy harvester consistent with the present invention when an annular groove is filled with an electrical and thermal insulating material and upper and lower supporting substrates each have a CMOS circuit structure.

Referring to FIG. 13 and FIG. 14, the basic structure of the three-dimensional thermoelectric energy harvester in this embodiment is as described in Embodiment 5 or 6. To achieve monolithic integration of the three-dimensional thermoelectric energy harvester consistent with the present invention and a circuit so as to directly supply power to the circuit on-chip, in the three-dimensional thermoelectric energy harvester of this embodiment, the upper supporting substrate 111 includes a CMOS circuit structure 113 and the lower supporting substrate 112 includes a CMOS circuit structure 114, and the upper passivation layer 121 and the lower passivation layer 122 each have a contact hole 115, and the CMOS circuit structures 113 and 114 are connected to the thermopile through the contact holes 115.

Embodiment 8

Referring to FIG. 11, the basic structure of the three-dimensional thermoelectric energy harvester in this embodiment is as described in Embodiment 5. To improve the sensitivity and efficiency of device, in the three-dimensional thermoelectric energy harvester consistent with the present invention, the annular groove 108 is vacuum or has a relatively low air pressure.

In summary, in the three-dimensional thermoelectric energy harvester and fabrication method thereof consistent with the present invention, low-resistivity silicon substrate is etched to form a plurality of grooves and silicon columns between the grooves, and an insulating layer is formed on a surface of the groove, and thermoelectric columns are fabricated by using a thin-film deposition technique, so that the thermoelectric column and a neighboring silicon column form a thermocouple pair; and then, a metal wiring is fabricated by processes such as etching and deposition, followed by thinning of the substrate and bonding of the supporting substrates, thereby completing fabrication of the three-dimensional thermoelectric energy harvester. Compared with a miniature thermoelectric energy harvester in the prior art, the present invention has the following advantages:

1) Fabrication of the thermocouple pair structure is completed by only one thin-film deposition process, which simplifies the fabrication process.

2) The use of silicon as a component of the thermocouple pair ensures that the thermocouple has a high Seebeck coefficient.

3) The use of vertical thermocouple pairs having a column structure improves the mechanical stability of the thermoelectric energy harvester.

4) Since the thermocouple structure is bonded to the upper supporting substrate and the lower supporting substrate by wafer-level bonding, the fabrication efficiency is improved.

Therefore, the present invention effectively overcomes the disadvantages in the prior art, and has high industrial applicability.

The above description of the detailed embodiments is only to illustrate the preferred implementation according to the present invention, and it is not to limit the scope of the present invention. Accordingly, all modifications and variations completed by one of ordinary skill in the art should fall within the scope of the present invention defined by the appended claims.

What is claimed is:

1. A method for fabricating a three-dimensional thermoelectric energy harvester, at least comprising:
   1) providing a silicon substrate, and etching an upper surface of the silicon substrate to form a plurality of grooves, two neighboring of which are arranged at an interval, so that the grooves and regions for preparing silicon columns between the grooves form a thermopile region;
   2) forming an insulating layer on a surface of the groove, and then filling a thermoelectric material in the grooves to form a plurality of thermoelectric columns, so that the thermoelectric column and silicon in a neighboring region for preparing a silicon column form a quasi thermocouple pair;
   3) fabricating an upper metal wiring to connect the thermoelectric column and silicon in the region for preparing a silicon column in a same quasi thermocouple pair, and then fabricating an upper passivation layer on the upper surface of the silicon substrate;
   4) providing an upper supporting substrate, and bonding the upper supporting substrate to the upper passivation layer;
   5) thinning the silicon substrate until a lower surface of the quasi thermocouple pair is exposed;
   6) fabricating a lower metal wiring to connect the thermoelectric column and silicon in the region for preparing a silicon column in two neighboring quasi thermocouple pairs, and then fabricating a lower passivation layer on a lower surface of the silicon substrate;
   7) etching the silicon substrate to form an annular groove in a periphery around the thermopile region, so as to isolate silicon in the regions for preparing silicon columns from the silicon substrate to form a plurality of silicon columns, so that the thermoelectric column and a neighboring silicon column form a thermocouple pair; and
   8) providing a lower supporting substrate, and bonding the lower supporting substrate to the lower passivation layer, thereby completing fabrication of the three-dimensional thermoelectric energy harvester.

2. The method for fabricating a three-dimensional thermoelectric energy harvester as in claim 1, wherein the thermoelectric column and the silicon column are rectangular column structures or cylindrical structures.

3. The method for fabricating a three-dimensional thermoelectric energy harvester as in claim 1, wherein the step 7) further comprises a step of filling an electrical and thermal insulating material in the annular groove.

4. The method for fabricating a three-dimensional thermoelectric energy harvester as in claim 1, wherein the bonding process in the step 4) is wafer-level hermetic bonding and the bonding process in the step 8) is wafer-level vacuum bonding.

5. The method for fabricating a three-dimensional thermoelectric energy harvester as in claim 1, wherein the upper supporting substrate and the lower supporting substrate each comprise a CMOS circuit structure, the upper passivation layer and the lower passivation layer each are etched to form a contact hole, and the CMOS circuit structures are connected to the upper metal wiring and the lower metal wiring through the contact holes.

6. The method for fabricating a three-dimensional thermoelectric energy harvester as in claim 1, wherein the thermoelectric column is made of a BiTe-based material, a polysilicon material, and metal Cu, Ni or Au, and the silicon substrate is a low-resistivity silicon wafer.

* * * * *